(12) United States Patent
 Wieduwilt et al.

(10) Patent No.: US 11,212,142 B2
(45) Date of Patent: Dec. 28, 2021

(54) TIMING BASED ARBITRATION METHODS AND APPARATUSES FOR CALIBRATING IMPEDANCES OF A SEMICONDUCTOR DEVICE

(71) Applicant: MICRON TECHNOLOGY, INC., Boise, ID (US)

(72) Inventors: Christopher G. Wieduwilt, Boise, ID (US); Jason Johnson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/107,671

(22) Filed: Nov. 30, 2020

(65) Prior Publication Data

US 2021/0083909 A1 Mar. 18, 2021

Related U.S. Application Data

(63) Continuation of application No. 16/574,814, filed on Sep. 18, 2019, now Pat. No. 10,855,495, which is a
(Continued)

(51) Int. Cl.
*H04L 25/02* (2006.01)
*G11C 7/10* (2006.01)
(Continued)

(52) U.S. Cl.
CPC ........ *H04L 25/0278* (2013.01); *G11C 7/1051* (2013.01); *G11C 7/1069* (2013.01); *G11C 11/4076* (2013.01); *G11C 11/4093* (2013.01); *G11C 16/32* (2013.01); *G11C 29/021* (2013.01); *G11C 29/028* (2013.01); *G11C 2207/2254* (2013.01)

(58) Field of Classification Search
None
See application file for complete search history.

(56) References Cited

U.S. PATENT DOCUMENTS

| 4,511,959 A | 4/1985 | Nicolas et al. |
| 4,745,548 A | 5/1988 | Blahut |

(Continued)

FOREIGN PATENT DOCUMENTS

| CN | 101552606 A | 10/2009 |
| JP | 2000049583 | 2/2000 |

(Continued)

OTHER PUBLICATIONS

EESR dated Feb. 17, 2021 for EP Application No. 18820468.9.
(Continued)

*Primary Examiner* — Anh Q Tran
(74) *Attorney, Agent, or Firm* — Dorsey & Whitney LLP

(57) ABSTRACT

Systems and apparatuses are provided for an arbiter circuit for timing based ZQ calibration. An example system includes a resistor and a plurality of chips. Each of the plurality of chips further includes a terminal coupled to the resistor and a calibration circuit. The calibration circuit determines whether the resistor is available based, at least in part, on timing information that is unique to a corresponding chip of the plurality of chip. The timing information of each chip of the plurality of chips has a fixed duration of time common to the plurality of chips.

20 Claims, 12 Drawing Sheets

Related U.S. Application Data continuation of application No. 16/146,489, filed on Sep. 28, 2018, now Pat. No. 10,530,613, which is a continuation of application No. 15/630,901, filed on Jun. 22, 2017, now Pat. No. 10,193,711.

(51) Int. Cl.
　　*G11C 11/4076*　　(2006.01)
　　*G11C 11/4093*　　(2006.01)
　　*G11C 16/32*　　(2006.01)
　　*G11C 29/02*　　(2006.01)

(56) References Cited

U.S. PATENT DOCUMENTS

| | | |
|---|---|---|
| 4,986,183 A | 1/1991 | Jacob et al. |
| 5,254,883 A | 10/1993 | Horowitz et al. |
| 5,729,154 A | 3/1998 | Taguchi et al. |
| 5,894,238 A | 4/1999 | Chien |
| 6,049,221 A | 4/2000 | Ishibashi et al. |
| 6,091,300 A | 7/2000 | Setty et al. |
| 6,262,625 B1 | 7/2001 | Perner et al. |
| 6,307,791 B1 | 10/2001 | Otsuka et al. |
| 6,377,117 B2 | 4/2002 | Oskowsky et al. |
| 6,509,778 B2 | 1/2003 | Braceras et al. |
| 6,556,052 B2 | 4/2003 | Garrett et al. |
| 6,661,860 B1 | 12/2003 | Gutnik et al. |
| 6,674,302 B2 | 1/2004 | Yen |
| 6,768,393 B2 | 7/2004 | Song |
| 6,807,650 B2 | 10/2004 | Lamb et al. |
| 6,836,143 B2 | 12/2004 | Song |
| 6,836,144 B1 | 12/2004 | Bui et al. |
| 6,836,170 B2 | 12/2004 | Kitagawa et al. |
| 6,839,286 B2 | 1/2005 | Cho et al. |
| 6,839,386 B2 | 1/2005 | Sato et al. |
| 6,917,217 B2 | 7/2005 | Herz |
| 6,947,336 B2 | 9/2005 | Kim et al. |
| 6,958,613 B2 | 10/2005 | Braun et al. |
| 6,967,500 B1 | 11/2005 | Lin et al. |
| 7,039,824 B2 | 5/2006 | Simon et al. |
| 7,148,721 B2 | 12/2006 | Park |
| 7,215,128 B2 | 5/2007 | Fujisawa |
| 7,239,198 B1 | 7/2007 | Drapkin et al. |
| 7,269,043 B2 | 9/2007 | Lee |
| 7,323,900 B2 | 1/2008 | Kim |
| 7,362,128 B2 | 4/2008 | Choi et al. |
| 7,414,427 B1 | 8/2008 | Bakker et al. |
| 7,432,731 B2 | 10/2008 | Bains et al. |
| 7,436,202 B2 | 10/2008 | Lin et al. |
| 7,443,193 B1 | 10/2008 | Santurkar et al. |
| 7,495,453 B2 | 2/2009 | Fujisawa |
| 7,626,416 B2 | 12/2009 | Kim |
| 7,646,213 B2 | 1/2010 | Kao |
| 7,852,112 B2 | 12/2010 | Kao |
| 7,898,290 B2 | 3/2011 | Kim |
| 7,902,858 B2 | 3/2011 | Kuwahara et al. |
| 7,973,553 B1 | 7/2011 | Wang et al. |
| 7,990,174 B2 | 8/2011 | Park |
| 8,446,167 B2 | 5/2013 | Kao |
| 8,483,986 B2 | 7/2013 | Riho |
| 9,106,222 B2 | 8/2015 | Kao |
| 9,294,072 B2 | 3/2016 | Kaneko et al. |
| 9,318,183 B2 | 4/2016 | Ware et al. |
| 9,531,382 B1 | 12/2016 | Miwa et al. |
| 9,614,497 B2 | 4/2017 | Kaneko et al. |
| 9,666,245 B2 | 5/2017 | Arai et al. |
| 9,711,189 B1 | 7/2017 | Wang et al. |
| 9,716,497 B2 | 7/2017 | Cho et al. |
| 9,740,269 B1 | 8/2017 | Tatapudi et al. |
| 9,766,831 B2 * | 9/2017 | Gans ............... G06F 13/368 |
| 9,767,921 B1 * | 9/2017 | Pan ................. G11C 29/26 |
| 9,786,352 B2 | 10/2017 | Yoshida et al. |
| 9,825,631 B1 | 11/2017 | Cho et al. |
| 10,026,457 B2 | 7/2018 | Arai et al. |
| 10,090,064 B2 | 10/2018 | Pan |
| 10,147,721 B1 | 12/2018 | Gada et al. |
| 10,193,711 B2 | 1/2019 | Wieduwilt et al. |
| 10,205,451 B1 | 2/2019 | Johnson |
| 10,269,395 B2 | 4/2019 | Arai et al. |
| 10,348,270 B2 | 7/2019 | Gans |
| 10,361,699 B2 | 7/2019 | Lee et al. |
| 10,504,571 B1 | 12/2019 | Johnson et al. |
| 10,530,613 B2 | 1/2020 | Wieduwilt et al. |
| 10,615,798 B2 | 4/2020 | Gans |
| 10,855,495 B2 | 12/2020 | Wieduwilt et al. |
| 10,868,519 B2 | 12/2020 | Gans |
| 11,121,714 B2 | 9/2021 | Gans |
| 2002/0063576 A1 | 5/2002 | Kim et al. |
| 2002/0113617 A1 | 8/2002 | Gergintschw et al. |
| 2003/0126356 A1 | 7/2003 | Gustavson et al. |
| 2003/0218914 A1 | 11/2003 | Kim et al. |
| 2003/0231523 A1 | 12/2003 | Cho et al. |
| 2003/0235084 A1 | 12/2003 | Zumkehr et al. |
| 2004/0113654 A1 | 6/2004 | Lundberg |
| 2004/0128429 A1 | 7/2004 | Khandekar et al. |
| 2004/0174185 A1 | 9/2004 | Lin et al. |
| 2005/0040845 A1 | 2/2005 | Park |
| 2005/0226080 A1 | 10/2005 | Lee |
| 2006/0158198 A1 | 7/2006 | Fujisawa |
| 2006/0158216 A1 | 7/2006 | Aoyama et al. |
| 2006/0226868 A1 | 10/2006 | Lee et al. |
| 2007/0040573 A1 | 2/2007 | Batt |
| 2007/0126471 A1 | 6/2007 | Jeong |
| 2007/0200591 A1 | 8/2007 | Kim |
| 2007/0217270 A1 | 9/2007 | Lee et al. |
| 2008/0054935 A1 | 3/2008 | Pan |
| 2008/0068040 A1 | 3/2008 | Morishima et al. |
| 2008/0088338 A1 | 4/2008 | Kim |
| 2008/0164905 A1 | 7/2008 | Hamanaka |
| 2008/0198666 A1 | 8/2008 | Nygren |
| 2008/0284465 A1 | 11/2008 | Kao |
| 2009/0009212 A1 | 1/2009 | Brox |
| 2009/0146756 A1 | 6/2009 | Fujisawa |
| 2009/0224802 A1 | 9/2009 | Hollis et al. |
| 2010/0097095 A1 | 4/2010 | Kao |
| 2010/0177588 A1 | 7/2010 | Kaiwa et al. |
| 2011/0066798 A1 | 3/2011 | Kaiwa et al. |
| 2011/0074463 A1 | 3/2011 | Kao |
| 2011/0102073 A1 | 5/2011 | Riho |
| 2011/0128038 A1 | 6/2011 | Ko |
| 2011/0283060 A1 | 11/2011 | Ware et al. |
| 2012/0007631 A1 | 1/2012 | Koo et al. |
| 2012/0056641 A1 | 3/2012 | Kuroki et al. |
| 2012/0099383 A1 | 4/2012 | Kim et al. |
| 2012/0212254 A1 | 8/2012 | Yokou et al. |
| 2013/0015880 A1 | 1/2013 | Haraguchi |
| 2013/0036253 A1 | 2/2013 | Baltar |
| 2013/0066253 A1 | 3/2013 | Bertrand et al. |
| 2013/0088257 A1 * | 4/2013 | Hara ............... H03K 19/00315 |
| | | 326/30 |
| 2013/0113517 A1 | 5/2013 | Ko |
| 2013/0257475 A1 | 10/2013 | Kao |
| 2013/0311717 A1 | 11/2013 | Kim et al. |
| 2013/0335114 A1 | 12/2013 | Chen et al. |
| 2014/0032890 A1 | 1/2014 | Lee et al. |
| 2014/0097911 A1 | 4/2014 | Kaiwa et al. |
| 2014/0185384 A1 | 7/2014 | Kim et al. |
| 2014/0185401 A1 | 7/2014 | Yang et al. |
| 2015/0019831 A1 | 1/2015 | Van Huben et al. |
| 2015/0022282 A1 | 1/2015 | Kaneko et al. |
| 2015/0067292 A1 * | 3/2015 | Grunzke ............... G11C 7/1057 |
| | | 711/170 |
| 2015/0117122 A1 | 4/2015 | Lee et al. |
| 2015/0235677 A1 | 8/2015 | Grunzke |
| 2015/0270010 A1 | 9/2015 | Kang |
| 2015/0340069 A1 | 11/2015 | Arai et al. |
| 2015/0364177 A1 | 12/2015 | Lee |
| 2016/0012879 A1 | 1/2016 | Eom et al. |
| 2016/0042769 A1 | 2/2016 | Moran |
| 2016/0118983 A1 | 4/2016 | Cho et al. |
| 2016/0164494 A1 | 6/2016 | Kaneko et al. |
| 2016/0164521 A1 | 6/2016 | Chung |
| 2016/0204782 A1 | 7/2016 | Lee et al. |
| 2016/0284386 A1 | 9/2016 | Mccall et al. |

(56) References Cited

U.S. PATENT DOCUMENTS

| | | |
|---|---|---|
| 2017/0109091 A1 | 4/2017 | Gans |
| 2017/0109249 A1 | 4/2017 | Tatapudi et al. |
| 2017/0148502 A1 | 5/2017 | Ikarashi |
| 2017/0162238 A1 | 6/2017 | Lee et al. |
| 2017/0221533 A1 | 8/2017 | Arai et al. |
| 2017/0228010 A1 | 8/2017 | Tatapudi et al. |
| 2017/0351451 A1 | 12/2017 | Gans |
| 2018/0167055 A1 | 6/2018 | Gans |
| 2018/0190368 A1 | 7/2018 | Pan |
| 2018/0286467 A1 | 10/2018 | Arai et al. |
| 2018/0375692 A1 | 12/2018 | Wieduwilt et al. |
| 2019/0036740 A1 | 1/2019 | Wieduwilt et al. |
| 2019/0131972 A1 | 5/2019 | Gans |
| 2019/0238133 A1 | 8/2019 | Johnson |
| 2019/0295609 A1 | 9/2019 | Arai et al. |
| 2019/0334505 A1 | 10/2019 | Gans |
| 2019/0362763 A1 | 11/2019 | Lee et al. |
| 2020/0036560 A1 | 1/2020 | Wieduwilt et al. |
| 2020/0252069 A1 | 8/2020 | Gans |
| 2021/0097209 A1 | 4/2021 | Kondo et al. |
| 2021/0099160 A1 | 4/2021 | Gans |
| 2021/0149423 A1 | 5/2021 | He et al. |

FOREIGN PATENT DOCUMENTS

| | | | |
|---|---|---|---|
| JP | 2007317229 A | | 12/2007 |
| JP | 2009237678 A | | 10/2009 |
| JP | 2015216513 A | | 12/2015 |
| JP | 2015219936 A | | 12/2015 |
| KR | 20070036578 A | | 4/2007 |
| KR | 1020070088845 A | | 8/2007 |
| KR | 1020080002692 A | | 1/2008 |
| KR | 20080018779 A | | 2/2008 |
| KR | 20120016462 A | | 2/2012 |
| KR | 101138834 | B1 | 5/2012 |
| KR | 1020120087662 A | | 8/2012 |
| KR | 20140078261 A | | 6/2014 |
| KR | 20150050021 A | | 5/2015 |
| TW | 201225079 A | | 6/2012 |
| TW | 201532051 A | | 8/2015 |
| TW | 201640358 A | | 11/2016 |
| WO | 2010144624 A1 | | 12/2010 |
| WO | 2015179068 A1 | | 11/2015 |
| WO | 2017066161 A1 | | 4/2017 |
| WO | 2018107076 A1 | | 6/2018 |
| WO | 2018125293 A1 | | 7/2018 |
| WO | 2018237272 A1 | | 12/2018 |
| WO | 2019089102 A1 | | 5/2019 |
| WO | 2019147428 A1 | | 8/2019 |

OTHER PUBLICATIONS

English translation of Office Action for KR Application No. 10-2020-7001519, dated May 14, 2021.

Translation of KR Office Action dated Nov. 9, 2020 for KR Application No. 10-2020-7001519, 9 pgs.

U.S. Appl. No. 17/119,664 titled "Apparatuses and Methods for Calibrating Adjustable Impedances of a Semiconductor Device", filed Dec. 11, 2020, pp. all.

Abandoned—U.S. Appl. No. 15/818,205, entitled 'Apparatuses and Methods for Calibrating Adjustable Impedances of a Semiconductor Device', filed Nov. 20, 2017.

Singh, et al., "MOUSETRAP: High-Speed Transition-Signaling Asynchronous Pipelines", IEEE Transactions on Very Large Scale Integration (VLSI) Systems, vol. 15, No. 6, Jun. 2007, 15 pages.

U.S. Appl. No. 16/440,565 titled "Device Having Multiple Channels With Calibration Circuit Shared By Multiple Channels" filed Jun. 13, 2019, pp. all pages of application as filed.

U.S. Appl. No. 17/444,771 titled "Apparatuses and Methods for Identifying Memory Devices of a Semiconductordevice Sharing an External Resistance" filed Aug. 10, 2021, pp. all pages of application as filed.

U.S. Appl. No. 15/997,417, titled "Device Having Multiple Channels With Calibration Circuit Shared By Multiple Channels" filed Jun. 4, 2018, pp. all pages of application as filed.

U.S. Appl. No. 16/688,870, titled "Apparatuses and Methods for ZQ Calibration", filed Nov. 19, 2019, pp. all pages of application as filed.

U.S. Appl. No. 16/987,262, titled "Apparatuses and Methods for ZQ Calibration", dated Aug. 6, 2020, pp. all pages of application as filed.

"On Die Termination", DDR II Topic, Aug. 2005, 2 pgs.

\* cited by examiner

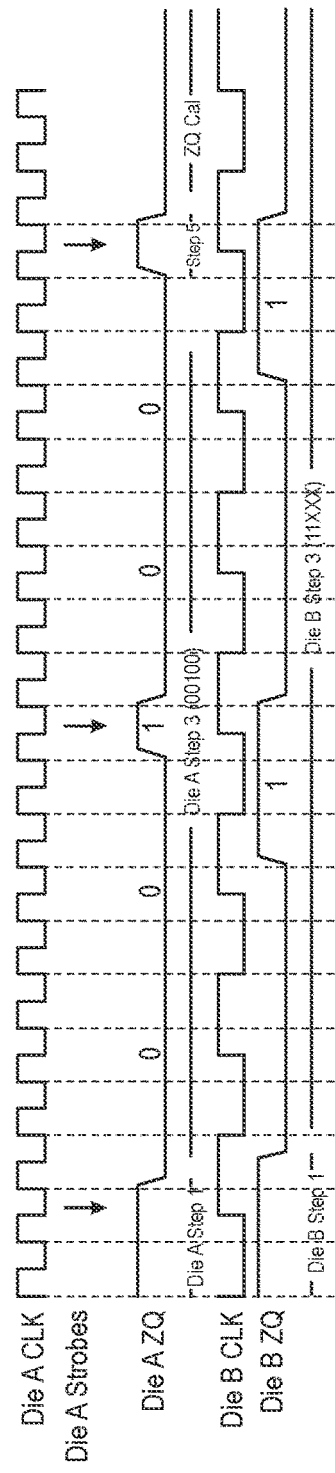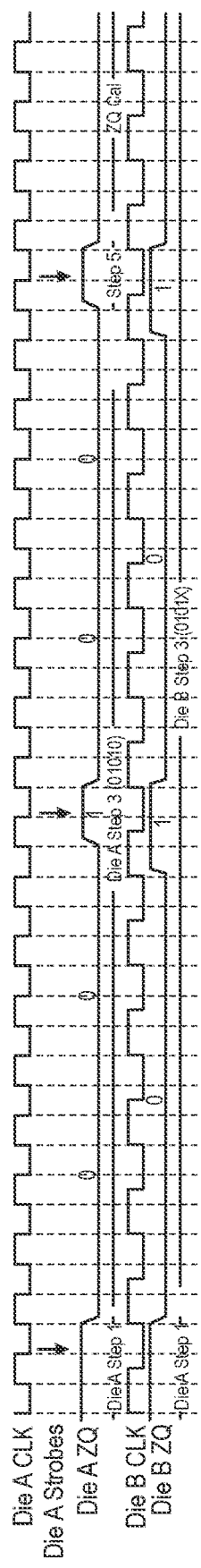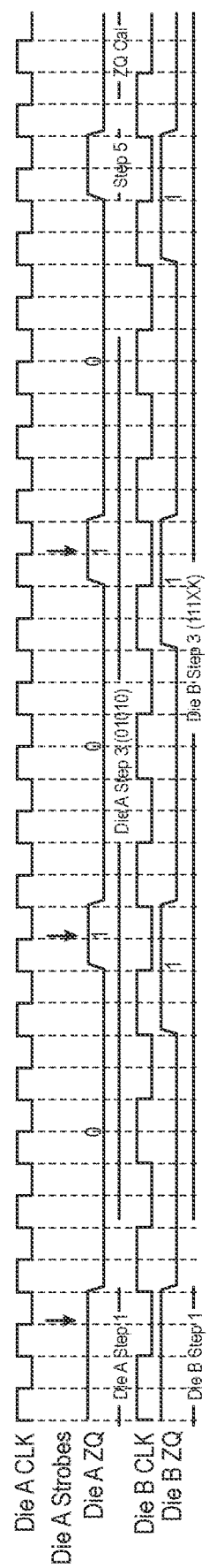
FIG. 7C
FIG. 7D
FIG. 7E

TIMING BASED ARBITRATION METHODS AND APPARATUSES FOR CALIBRATING IMPEDANCES OF A SEMICONDUCTOR DEVICE

CROSS-REFERENCE TO RELATED APPLICATION(S)

This application is a continuation pending U.S. patent application Ser. No. 16/574,814 filed Sep. 18, 2019, which is a continuation of U.S. patent application Ser. No. 16/146,489 filed Sep. 28, 2018 and issued as U.S. Pat. No. 10,530,613 on Jan. 7, 2020, which is a continuation of U.S. patent application Ser. No. 15/630,901, filed Jun. 22, 2017 and issued as U.S. Pat. No. 10,193,711 on Jan. 29, 2019. The afore-mentioned applications, and issued patents, are incorporated by reference herein, in its entirety, and for any purposes.

BACKGROUND

High data reliability, high speed of memory access, and reduced chip size are features that are demanded from semiconductor memory. In recent years, there has been an effort to further increase the speed of memory access.

In conventional peripheral circuitries for a semiconductor memory device, for example, pads and data input/output circuits are arranged in a corresponding manner across layers. For example, a semiconductor memory device may include a data input/output circuit. To achieve high speed transmission, the impedance of the data input/output circuit should be controlled. To control the impedance, an external resistance, such as ZQ resistor may be coupled. The semiconductor memory device including a plurality of chips are generally provided with one external ZQ resistor. When two or more chips request to use the ZQ resistor at the same time, an arbiter circuit is typically used to determine which chip should access the ZQ resistor. Accordingly, one chip can access the ZQ resistor, and a subsequent chip may access the ZQ resistor after ZQ calibration for the one chip has been completed.

For example, arbiter circuits may rely on a voltage based arbitration scheme to determine which chip, a master chip or slave chip, has issued a ZQ calibration request. In the voltage based arbitration scheme, a ZQ calibration request issued by the master chip may have a strong pulldown, while a ZQ calibration request issued by the slave chip may have a weak pulldown. Thus, various states of use of the ZQ resistor may be determined, via a ZQ pad voltage. However, chip packages with multiple-chips and/or of a low-power consumption type may not be able to effectively differentiate between multiple states via the ZQ pad voltage by the voltage based arbitration scheme.

For example, some recent semiconductor devices (e.g., low-power double data rate synchronous DRAM), such as Low Power Double Data Rate 4 (LPDDR4), adopted a time based arbitration scheme. Under the time based arbitration scheme, each chip sharing a ZQ resistor is programmed with a unique time delay to create a master-slave hierarchy. This time based arbitration scheme enables any number of chips in the semiconductor memory device per package to use the ZQ resistor, although the required time increases exponentially according to the number of chips. For example, the semiconductor memory device including 16 chips sharing a single ZQ resistor may need 16 different delay variations for the 16 chips.

Thus, an arbitration circuit implementing an arbitration scheme is needed for a semiconductor memory device having a larger number of chips to complete the ZQ calibration without extending time for ZQ calibration request arbitration.

BRIEF DESCRIPTION OF THE DRAWINGS

FIG. 7C is a timing diagram of a plurality of arbitration signal patterns for a plurality of chips in accordance with an embodiment of the present disclosure.

FIG. 7D is a timing diagram of a plurality of arbitration signal patterns for a plurality of chips in accordance with an embodiment of the present disclosure.

FIG. 7E is a timing diagram of a plurality of arbitration signal patterns for a plurality of chips in accordance with an embodiment of the present disclosure.

DETAILED DESCRIPTION OF THE EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
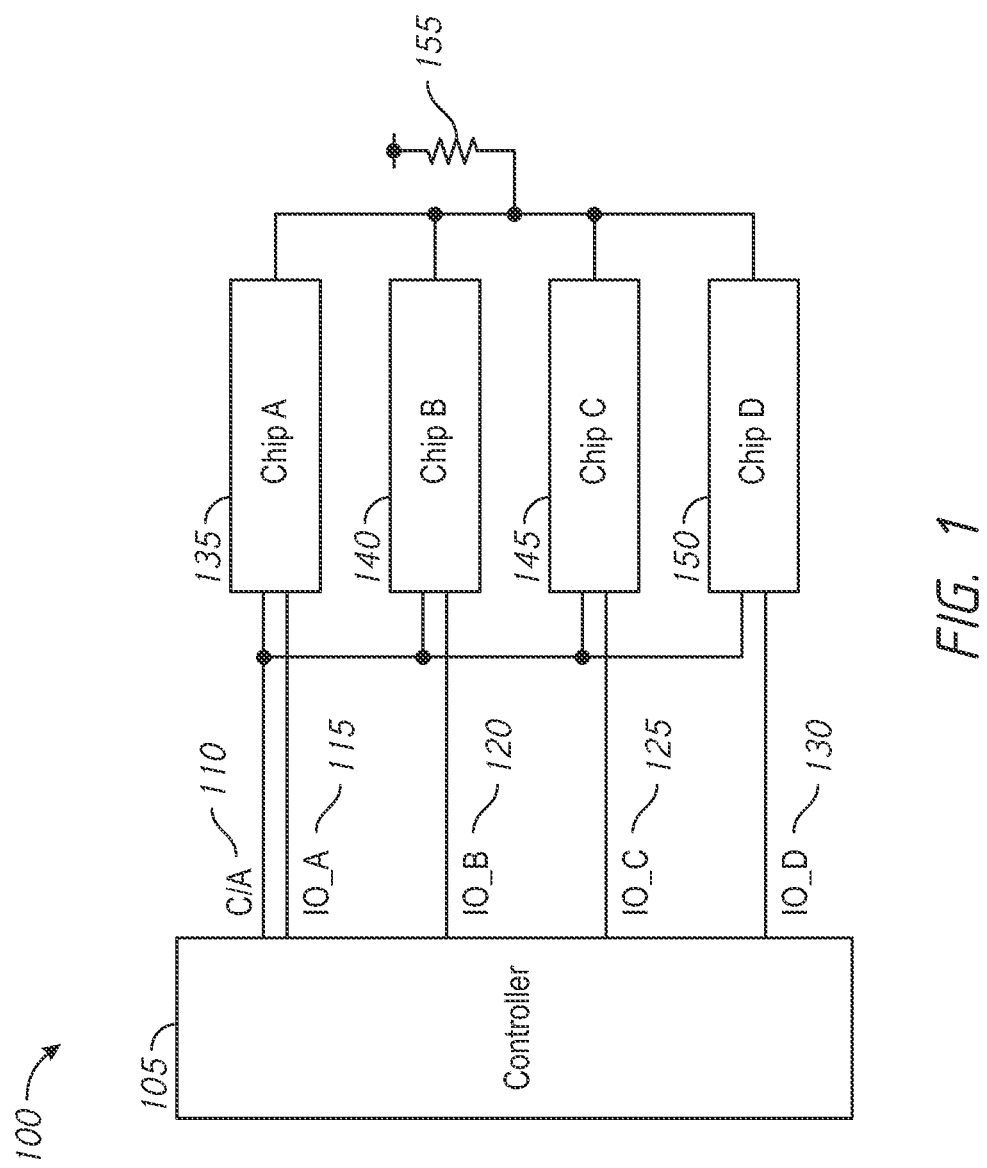
FIG. 1 is a schematic block diagram of a semiconductor memory device including a plurality of chips, in accordance with an embodiment of the present disclosure.

FIG. 1 is a schematic block diagram of a semiconductor memory device 100 including a plurality of chips 135, 140, 145 and 150, in accordance with an embodiment of the present disclosure. The semiconductor memory device 100 may include a controller 105, a command/address bus 110, respective I/O buses IO_A 115, IO_B 120, IO_C 125, and IO_D 130, chip A 135, chip B 140, chip C 145, chip D 150, and a ZQ resistor 155. For example, the semiconductor memory device 100 may be packaged in a multi-chip package (MCP) or a package on packages (POP). In the following embodiments, the terms chip and die may be used interchangeably. In some embodiments, the controller 105 may be a memory controller. The controller 105 may be implemented as part of the same chip, a separate chip, or integrated into another chip, such as a microprocessor. The controller 105 may be coupled to each of the chips 135, 140, 145, and 150, via a command/address bus 110. The controller 105 may further be coupled to each of the chips 135, 140, 145, and 150, respectively, via respective I/O buses 115, 120, 125 and 130. Each of the chips 135, 140, 145 and 150 may then have their calibration terminals coupled to the ZQ resistor 155. Accordingly, the ZQ resistor 155 may be shared among the chips 135, 140, 145 and 150. For example, each of the chips 135, 140, 145 and 150 may individually be a memory device, including, without limitation, NAND flash memory, dynamic random access memory (DRAM) and synchronous DRAM (SDRAM). Alternatively, each of the chip may be a semiconductor device, such as a controller (e.g., the controller 105).

In these embodiments, because the ZQ resistor 155 is shared among the chips 135, 140, 145 and 150 and the command/address bus 110 coupled to the controller 105 may also be shared among the chips 135, 140, 145 and 150, each of the chips 135, 140, 145 and 150 may be configured to receive commands concurrently, including ZQ calibration commands. As previously discussed, ZQ calibration operations may not typically be performed simultaneously among the chips 135, 140, 145 and 150, so arbitration is required to determine the order in which the chips 135, 140, 145 and 150, requesting ZQ calibration, may perform a ZQ calibration operation. Accordingly, arbiter circuits may be provided to control ZQ calibration operations. Although in FIG. 1 the command/address bus 110 is shared, this should not be taken as a limiting example. Thus, in other embodiments, the command/address bus 110 may include respective lines to the chips 135, 140, 145 and 150 from the controller 105.

Figure 2:
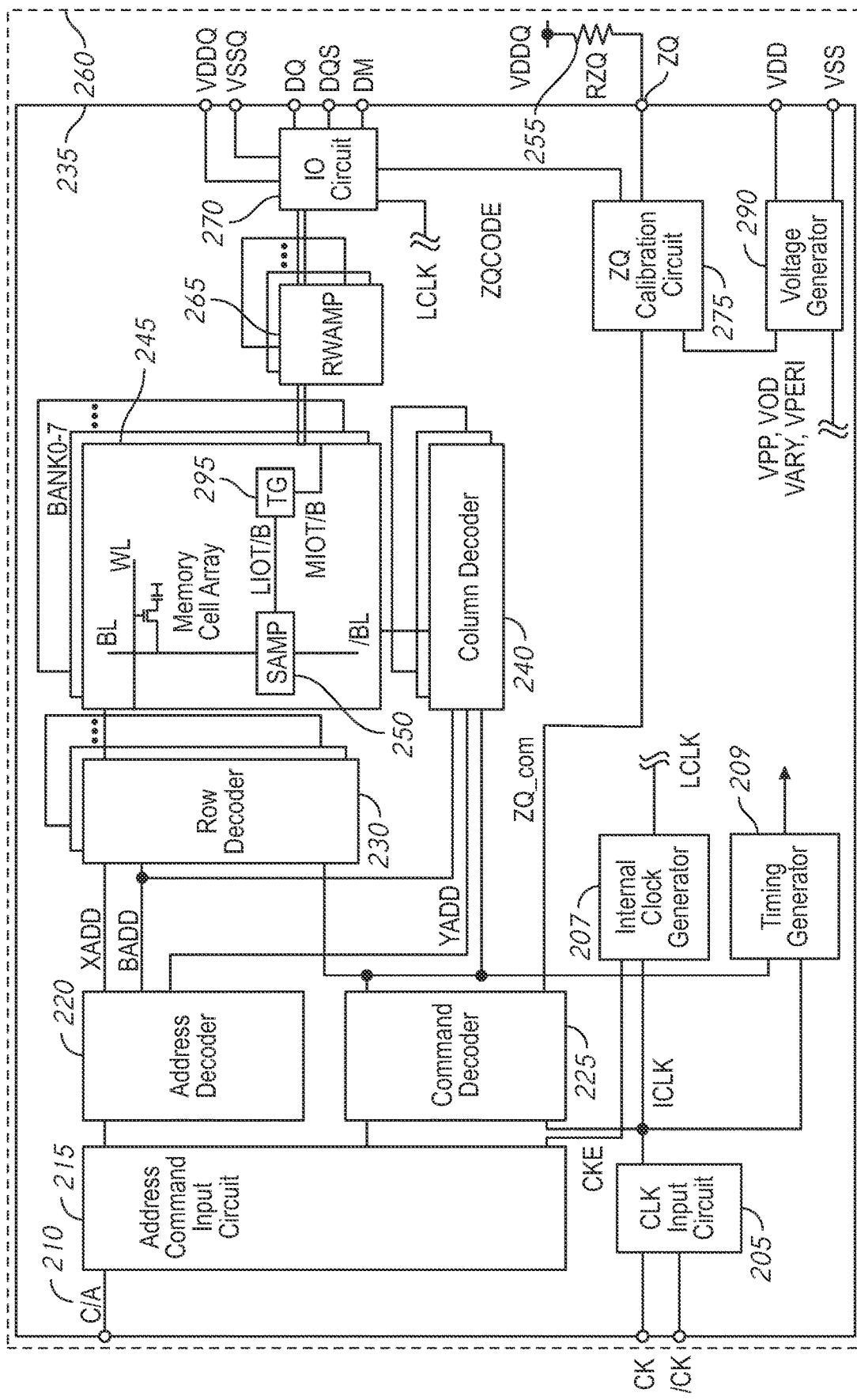
FIG. 2 is a schematic block diagram of a chip of the semiconductor memory device, in accordance with an embodiment of the present disclosure.

FIG. 2 is a schematic block diagram of a chip 235 of the semiconductor memory device 200, in accordance with an embodiment of the present disclosure. For example, the semiconductor memory device 200 may include a ZQ resistor (RZQ) 255 and a plurality of chips, including the chip 235. For example, the semiconductor memory device 200 including the chip 235 and the ZQ resistor (RZQ) 255 may be used as the semiconductor memory device 100 including the chip 135 the ZQ resistor 155 previously described regarding FIG. 1.

For example, the chip 235 may include a clock input circuit 205, an internal clock generator 207, a timing generator 209, an address command input circuit 215, an address decoder 220, a command decoder 225, a plurality of row decoders 230, a memory cell array 245 including sense amplifiers 250 and transfer gates 295, a plurality of column decoders 240, a plurality of read/write amplifiers 265, an input/output (I/O) circuit 270, the ZQ resistor (RZQ) 255, a ZQ calibration circuit 275, and a voltage generator 290. The semiconductor memory device 200 may include a plurality of external terminals including address and command terminals coupled to command/address bus 210, clock terminals CK and/CK, data terminals DQ, DQS, and DM, power supply terminals VDD, VSS, VDDQ, and VSSQ, and a calibration terminal ZQ. The chip 235 may be mounted on a substrate 260, for example, a memory module substrate, a mother board or the like.

The memory cell array 245 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL for each bank is performed by a corresponding row decoder 230 and the selection of the bit line BL is performed by a corresponding column decoder 240. The plurality of sense amplifiers 250 are located for their corresponding bit lines BL and coupled to at least one respective local I/O line further coupled to a respective one of at least two main I/O line pairs, via transfer gates TG 295, which function as switches.

The address/command input circuit 215 may receive an address signal and a bank address signal from outside at the command/address terminals via the command/address bus 210 and transmit the address signal and the bank address signal to the address decoder 220. The address decoder 220 may decode the address signal received from the address/command input circuit 215 and provide a row address signal XADD to the row decoder 230, and a column address signal YADD to the column decoder 240. The address decoder 220 may also receive the bank address signal and provide the bank address signal BADD to the row decoder 230 and the column decoder 240.

The address/command input circuit 215 may receive a command signal from outside, such as, for example, a memory controller 105 at the command/address terminals via the command/address bus 210 and provide the command signal to the command decoder 225. The command decoder 225 may decode the command signal and provide generate various internal command signals. For example, the internal command signals may include a row command signal to select a word line, a column command signal, such as a read command or a write command, to select a bit line, and a ZQ calibration command that may activate the ZQ calibration circuit 275.

Accordingly, when a read command is issued and a row address and a column address are timely supplied with the read command, read data is read from a memory cell in the memory cell array 245 designated by the row address and the column address. The read/write amplifiers 265 may receive the read data DQ and provide the read data DQ to the IO circuit 270. The IO circuit 270 may provide the read data DQ to outside via the data terminals DQ, DQS and DM together with a data strobe signal at DQS and a data mask signal at DM. Similarly, when the write command is issued and a row address and a column address are timely supplied with the write command, and then the input/output circuit 270 may receive write data at the data terminals DQ, DQS, DM, together with a data strobe signal at DQS and a data mask signal at DM and provide the write data via the read/write amplifiers 265 to the memory cell army 245. Thus, the write data may be written in the memory cell designated by the row address and the column address.

Turning to the explanation of the external terminals included in the semiconductor device 200, the clock terminals CK and /CK may receive an external clock signal and a complementary external clock signal, respectively. The external clock signals (including complementary external clock signal) may be supplied to a clock input circuit 205. The clock input circuit 205 may receive the external clock signals and generate an internal clock signal ICLK. The clock input circuit 205 may provide the internal clock signal ICLK to an internal clock generator 207. The internal clock generator 207 may generate a phase controlled internal clock signal LCLK based on the received internal clock signal ICLK and a clock enable signal CKE from the address/command input circuit 215. Although not limited thereto, a DLL circuit may be used as the internal clock generator 207. The internal clock generator 207 may provide the phase controlled internal clock signal LCLK to the IO circuit 270 and a timing generator 209. The IO circuit 270 may use the phase controller internal clock signal LCLK as a timing signal for determining an output timing of read data. The timing generator 209 may receive the internal clock signal ICLK and generate various internal clock signals.

The power supply terminals may receive power supply voltages VDD and VSS. These power supply voltages VDD and VSS may be supplied to a voltage generator circuit 290. The voltage generator circuit 290 may generate various internal voltages, VPP, VOD, VARY, VPERI, and the like based on the power supply voltages VDD and VSS. The internal voltage VPP is mainly used in the row decoder 230, the internal voltages VOD and VARY are mainly used in the sense amplifiers 250 included in the memory cell array 245, and the internal voltage VPERI is used in many other circuit blocks. The power supply terminals may also receive power supply voltages VDDQ and VSSQ. The IO circuit 270 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 270 and the ZQ calibration circuit 275.

The calibration terminal ZQ of the semiconductor memory device 200 may be coupled to the ZQ calibration circuit 275. The ZQ calibration circuit 275 may perform a calibration operation with reference to an impedance of the ZQ resistor (RZQ) 255. For example, the ZQ resistor (RZQ) 255 may be mounted on the substrate 260 that is coupled to the calibration terminal ZQ. For example, the ZQ resistor (RZQ) 255 may be coupled to a power supply voltage (VDDQ). An impedance code ZQCODE obtained by the calibration operation may be provided to the IO circuit 270, and thus an impedance of an output buffer (not shown) included in the IO circuit 270 is specified.

Figure 3:
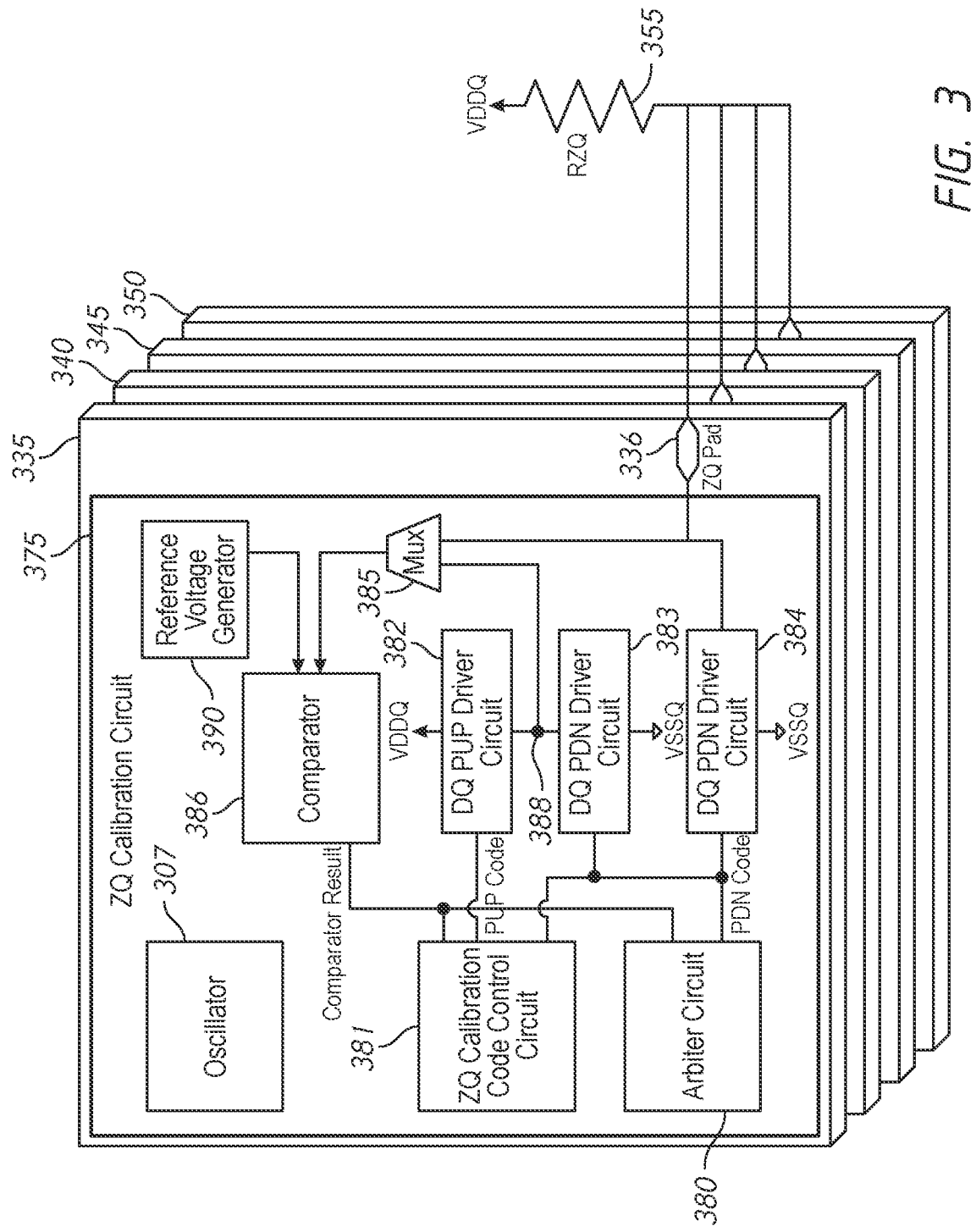
FIG. 3 is a circuit diagram of a ZQ calibration circuit in accordance with an embodiment of the present disclosure.

FIG. 3 is a circuit diagram of a ZQ calibration circuit 375 in accordance with an embodiment of the present disclosure. For example, each chip of the plurality of chips 335, 340, 345 and 350 may include the ZQ calibration circuit 375 and a calibration terminal ZQ (e.g., ZQ pad) 336. For example, the ZQ calibration circuit 375 may include an arbiter circuit 380. The arbiter circuit 380 may be activated responsive to an activation of a chip (e.g., power on, etc.). For example, the arbiter circuit 380 may provide a pull-down (PDN) code signal. The ZQ calibration circuit 375 may include a combination of a data terminal (DQ) pull-up (PUP) driver circuit 382 and a data terminal (DQ) pull-down (PDN) driver circuit 383 and a data terminal (DQ) pull-down (PDN) driver circuit 384 for arbitration as well as calibration, that are replica circuits of a data terminal (DQ) pull-up (PUP) driver circuit, a data terminal (DQ) pull-down (PDN) driver circuit and a data terminal (DQ) pull-down (PDN) driver circuit attached to actual data terminals DQ. The DQ PDN driver circuit 384 may receive the PDN code signal from the arbiter circuit 380, and may pull down a ZQ pad voltage (VZQ) at the calibration terminal ZQ 336 responsive to the PDN code signal. The ZQ pad voltage (VZQ) may be provided to a switch 385 (e.g., multiplexer Mux). The combination of the DQ PUP driver circuit 382 and the DQ PDN driver circuit 383 may execute adjustment of an intermediate ZQ voltage (iVZQ) at an intermediate node 388 between the combination of the DQ PUP driver circuit 382 and the DQ PDN driver circuit 383. For example, the DQ PUP driver circuit 382 may include a plurality of transistors coupled in parallel between a power supply terminal VDDQ and the intermediate node 388. The DQ PDN driver circuit 383 may include a plurality of transistors coupled in parallel between a power supply terminal VSSQ and the intermediate node 388. The intermediate ZQ voltage (iVZQ) may be provided to the switch 385. The switch 385 may provide either the ZQ pad voltage VZQ or the intermediate ZQ voltage iVZQ, depending on whether the ZQ calibration circuit 375 is executing arbitration or ZQ calibration, respectively. For example, the ZQ calibration circuit 375 may include a comparator 386. The comparator 386 may compare either the ZQ pad voltage VZQ or the intermediate ZQ voltage iVZQ provided by the switch 385 with a ZQ reference voltage ZQVREF or a ZQ arbitration reference voltage provided by a reference voltage generator 390. For example, the reference voltage generator 390 may be included in the ZQ calibration circuit 375, or the voltage generator 290 in FIG. 2 may provide the ZQ reference voltage ZQVREF and the ZQ arbitration reference voltage instead. For example, the comparator 386 may determine whether the ZQ pad voltage (VZQ) has been controlled by another requesting chip or the ZQ resistor RZQ 255 is currently in use.

The comparator 386 may provide a comparator result signal to the arbiter circuit 380 and a ZQ calibration code control circuit 381. For example, the arbiter circuit 380 may provide ZQ pad voltage control via the DQ PDN driver circuit 384 according to a ZQ timing pattern unique to the chip, having a fixed duration common to the plurality of chips. The arbiter circuit 380 may provide the PDN code until the ZQ pad voltage (VZQ) at the calibration terminal ZQ 336 using the ZQ arbitration reference voltage, which may be different from the ZQ reference voltage ZQVREF. The ZQ timing pattern is unique for each chip, in order to determine whether the requesting chip should gain access to a ZQ resistor RZQ 355. The ZQ timing pattern may be programmed, or otherwise stored for each chip. For example, the arbiter circuit 380 for the chip 335 may include a register (not shown) for the chip 335 that may be programmed with the ZQ timing pattern information specific to the chip 335 for a duration common to the chips. Thus, each arbiter circuit 380 for each respective chip may be configured to store the ZQ timing pattern information of a duration that is different from ZQ timing pattern information having the same duration, stored on the registers of the other chips. For example, the timing pattern information may be unique to an individual chip among a plurality of chips of the semiconductor memory device 200. The register may include, without limitation, programmable fuses, anti-fuses, a mode register, or other suitable components. Thus, the priority of a chip may be set or programmed via the register. The ZQ calibration code control circuit 381 may be included in the ZQ calibration circuit 375. The ZQ calibration code control circuit 381 may provide a PUP code and a PDN code to the DQ PUP driver circuit 382 and the DQ PDN driver circuit 383 respectively, responsive to the comparator result signal until the intermediate ZQ voltage iVZQ at the intermediate node 388 may match the ZQ reference voltage ZQVREF.

Figures 4A, 4B:
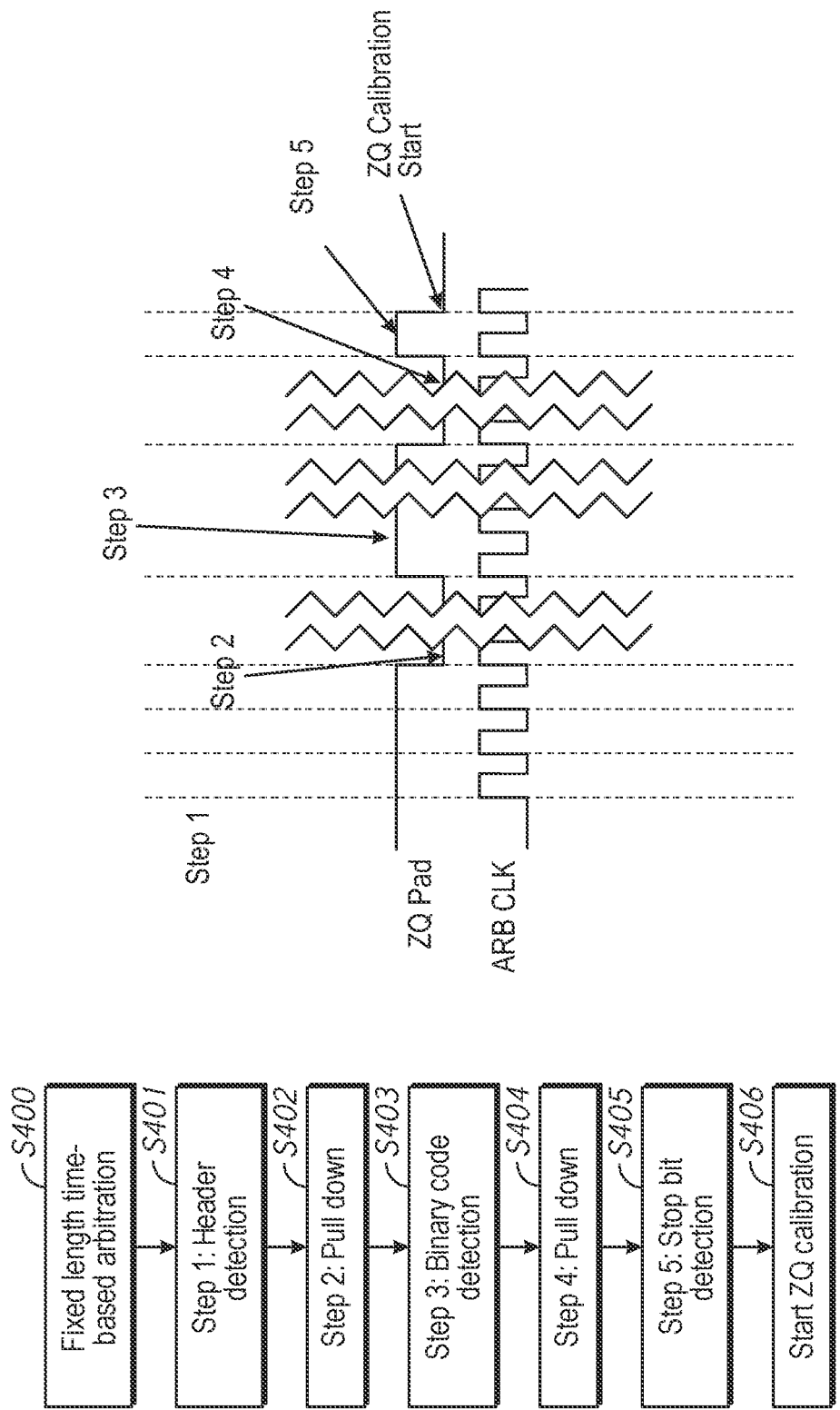
FIG. 4A is a flow diagram of a ZQ calibration arbitration in accordance with an embodiment of the present disclosure.
FIG. 4B is a timing diagram of an arbitration clock and a ZQ pad voltage in the ZQ calibration arbitration in accordance with an embodiment of the present disclosure.

FIG. 4A is a flow diagram of a ZQ calibration arbitration in accordance with an embodiment of the present disclosure. FIG. 4B is a timing diagram of an arbitration clock and a ZQ pad voltage VZQ in the ZQ calibration arbitration in accordance with the embodiment of the present disclosure. For example, the ZQ calibration may start with a fixed length time-based arbitration (S400). Each chip may provide a request for the ZQ calibration using a ZQ resistor (e.g., the ZQ resistor 255, 355). The first step (Step 1, S401) of the fixed length time-based arbitration is header detection. For example, an initial state of the fixed length time-based arbitration may be that the ZQ pad voltage being set to a float high state (e.g., disabling the DQ PDN driver circuit 384) to provide a header. For example, the header may be signaled by the ZQ pad voltage VZQ being maintained at a logic high level for three clock cycles. The ZQ pad voltage VZQ may be compared (e.g., by the comparator 386) with a ZQ arbitration reference voltage at an end of each clock cycle of three clock cycles. For example, the ZQ arbitration reference voltage may be in-between a pull-down voltage range (e.g., substantially 0V) signaling a logic low state and the power supply voltage VDDQ signaling the logic high state. Because the ZQ resistor may be coupled to the power supply voltage VDDQ (or VSS) and the header is at the logic high state (or a logic low state), another chip may be executing either the ZQ calibration arbitration process or the ZQ calibration process, if the ZQ pad voltage VZQ is in the pull-down voltage range, lower than the ZQ arbitration reference voltage. Thus, the current request fails and repeats Step 1 of the ZQ arbitration to re-request the ZQ calibration. If the ZQ pad voltage VZQ is higher than the ZQ arbitration reference voltage during Step 1, the request may proceed to the second step. The second step may include pulling down the ZQ pad voltage for a certain period (Step 2, S402) to signal that the ZQ calibration is being requested to the other chip. For example, the duration of this pulling down may be two clock cycles, or other clock cycles, without limitation.

The third step (Step 3, S403) of the fixed length time-based arbitration may include a binary coding and detection. For each chip, a die number that may be a binary code unique to each chip may be assigned and signaled as a unique ZQ timing pattern. The die number may be used to determine chip priority. The ZQ pad voltage VZQ may be compared (e.g., by the comparator 386) with a ZQ arbitration reference voltage at an end of each clock cycle of a fixed duration of the ZQ timing pattern common to the chips. For each chip, pulling down the ZQ pad voltage VZQ may be disabled for one clock cycle if a bit in the die number for the current chip is high. Because the ZQ resistor may be coupled to the power supply voltage VDDQ (or VSS) and the die number for the current chip corresponds to the logic high state (or a logic low state), another chip may be executing either the ZQ calibration arbitration process with priority or the ZQ calibration, if the ZQ pad voltage VZQ is in the pull-down voltage range (or in the pull-up voltage range). Thus, the current request fails and repeats Step 1 of the ZQ arbitration to re-request the ZQ calibration. For example, increasing the minimum clock cycles of the logic low state between the two logic high states may improve detection of the comparator's comparator result. After Step 3 (S403), the request may include the fourth step of pulling down the ZQ pad voltage for a certain period (Step 4, S405) to signal that the ZQ calibration is being requested to the other chip. For example, the duration of this pulling down may be two clock cycles, or other clock cycles, without limitation.

The fifth step (Step 5, S405) of the fixed length time-based arbitration may include a stop bit detection. For each chip, a common stop bit of a fixed duration (e.g., one clock cycle) of the ZQ timing pattern common to the chips may be signaled by disabling pulling down the ZQ pad voltage VZQ for the fixed duration (e.g., one clock cycle) corresponding to the stop bit. The ZQ pad voltage VZQ may be compared (e.g., by the comparator 386) with a ZQ arbitration reference voltage at an end of the fixed duration (e.g., one clock cycle) signaling the stop bit. The ZQ resistor may be coupled to the power supply voltage VDDQ and the ZQ pad voltage VZQ corresponds to the stop bit is supposed to be at the logic high state. Thus, the arbitration passes and ZQ calibration process for the current chip may be initiated, if the ZQ pad voltage VZQ is at the logic high state (e.g., in the pull-up voltage range). Another chip may be executing either the ZQ calibration arbitration processor the ZQ calibration process, if the ZQ pad voltage VZQ is in the pull-down voltage range, and the current request fails and repeats Step 1 of the next ZQ arbitration to re-request the ZQ calibration.

Figure 5:
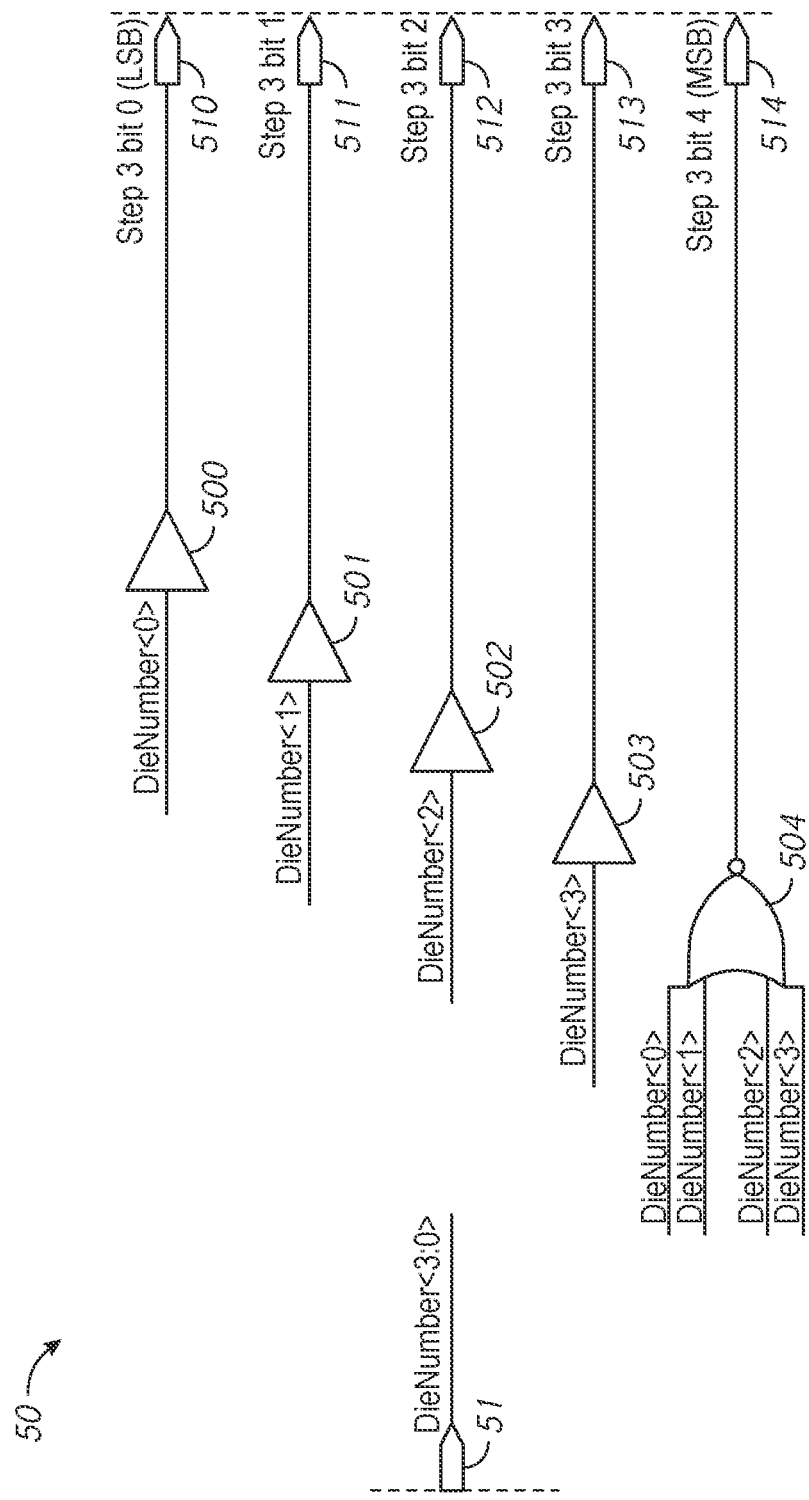
FIG. 5 is a schematic diagram of an arbiter circuit in the ZQ calibration circuit in accordance with an embodiment of the present disclosure.

FIG. 5 is a schematic diagram of an arbiter circuit 50 in the ZQ calibration circuit in accordance with an embodiment of the present disclosure. For example, the arbiter circuit 50 may be the arbiter circuit 380 in FIG. 3. The arbiter circuit 50 may include a set of fuses indicating a set of die number <3:0> signals (e.g., the die number in Step 3 S403 of FIGS. 4A and 4B) of a current chip (die) among a plurality of chips among in a semiconductor memory device. For example, the arbiter circuit 50 may include buffers 500, 501, 502 and 503 that may receive and provide the die number <0>, the die number <1>, the die number <2> and the die number <3> respectively in Step 3 (S403). The arbiter circuit 50 may include output terminals 510, 511, 512 and 513. The output terminal 510 may provide the die number <0> signal as a first bit (bit 0) of the ZQ timing pattern in Step 3. The output terminal 511 may provide the die number <1> signal as a second bit (bit 1) of the ZQ timing pattern in Step 3. The output terminal 512 may provide the die number <2> signal as a third bit (bit 2) of the ZQ timing pattern in Step 3. The output terminal 513 may provide the die number <3> signal as a fourth bit (bit 3) of the ZQ timing pattern in Step 3.

The arbiter circuit 50 may also include a logic circuit 504 (e.g., a NOR circuit) and an output terminal 514. The logic circuit 504 may receive the die number <0>-<3> signals and provide an active state signal (e.g., at a logic high level) when a chip having all the die number <0>-<3> signals are inactive (e.g., a logic low level) is requesting for the ZQ calibration in Step 3 (S403). The output terminal 514 may provide the active state signal as a fifth bit (bit 4) of the ZQ timing pattern in Step 3 to indicate if the chip having all the die number <0>-<3> signals is requesting for the ZQ calibration.

Figure 6A:
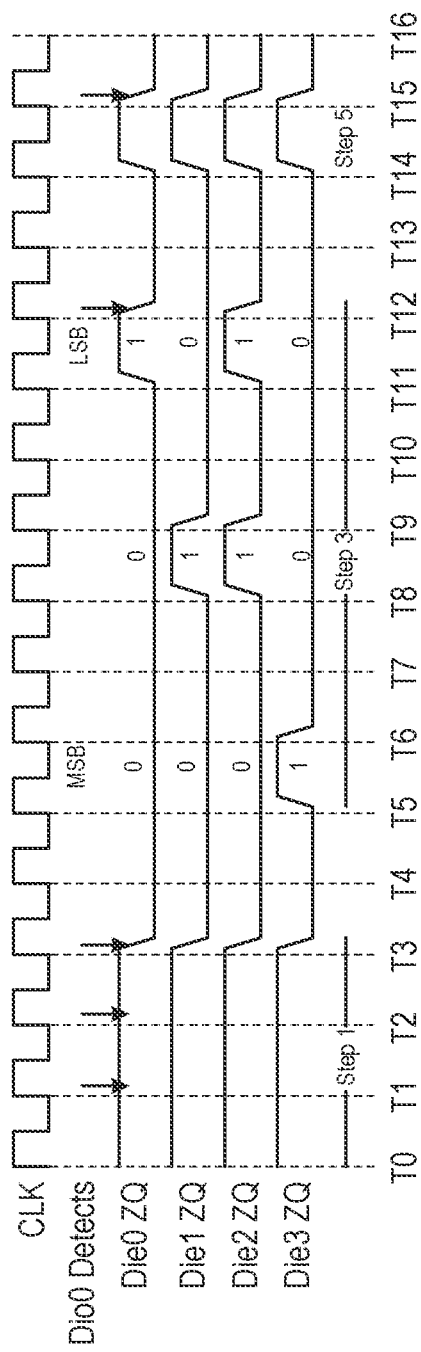
FIG. 6A is a timing diagram of a plurality of arbitration signal patterns for a plurality of chips in accordance with an embodiment of the present disclosure.

FIG. 6A is a timing diagram of a plurality of arbitration signal patterns for a plurality of chips in accordance with an embodiment of the present disclosure. For example, the plurality of chips may include Die0, Die1, Die2 and Die3. In fixed length time-based arbitration, each chip, Die0, Die1, Die2 and Die3 may provide a request for the ZQ calibration using a ZQ resistor (e.g., the ZQ resistor 255, 355). The first step of the fixed length time-based arbitration is the header detection (e.g., Step 1, S401 in FIG. 4A) that may be executed by the ZQ pad voltage control by setting the ZQ pad voltage to a float high state (e.g., by disabling the DQ PDN driver circuit 384) to provide a header. For example, the header may be signaled for three clock cycles from T0, which is common for any chip of the plurality of chips, Die0, Die1, Die2 and Die3. Each chip requesting the ZQ calibration may compare the ZQ pad voltage VZQ (e.g., by the comparator 386) with a ZQ arbitration reference voltage in-between the pull-down voltage range and the power supply voltage VDDQ at an end of each clock cycle at T1, T2 and T3 during Step 1 (S401). Because the ZQ resistor may be coupled to the power supply voltage VDDQ and the ZQ pad voltage control any chip requesting ZQ calibration pulls up the ZQ pad voltage to the logic high state, another chip may be executing either the ZQ calibration arbitration process or the ZQ calibration process, if the ZQ pad voltage VZQ is in the pull-down voltage range, lower than the ZQ arbitration reference voltage. Thus, the current request fails and repeats the ZQ arbitration to re-request the ZQ calibration. If the ZQ pad voltage VZQ is higher than the ZQ arbitration reference voltage for each clock cycle of Step 1 (S401), the fixed length time-based arbitration may proceed to a second step (Step 2, S402). The second step, pulling down the ZQ pad voltage for a certain period (Step 2, S402) following Step 1 may be executed to signal that the ZQ calibration is being requested to the other chip. For example, the duration of this pulling down may be two clock cycles from T3 to T5 as shown in FIG. 6A. Alternatively other clock cycles, without limitation may be used for Step 2.

The third step (Step 3, S403) of the fixed length time-based arbitration may include a binary coding and detection, from T5 to T12 as shown in FIG. 6A. For each chip, a die number that may be a binary code unique to each chip may be assigned and signaled as a unique ZQ timing pattern. The die number may be used to determine chip priority. For each chip, pulling down the ZQ pad voltage VZQ may be disabled for one clock cycle if a bit in the die number for the current chip is high. For example, Die0 may have a die number "001", and pulling down the ZQ pad voltage VZQ may be disabled for a clock cycle from T11 to T12 corresponding to the third bit "1" in "001". Die1 may have a die number "010", and pulling down the ZQ pad voltage VZQ may be disabled for a clock cycle from T8 to T9 corresponding to the second bit "1" in "010". Die2 may have a die number "011", and pulling down the ZQ pad voltage VZQ may be disabled for a clock cycle from T8 to T9 corresponding to the second bit "1" in "011" and a clock cycle from T11 to T12 corresponding to the third bit "1" in "011". Die3 may have a die number "100", and pulling down the ZQ pad voltage VZQ may be disabled for a clock cycle from T5 to T6 corresponding to the first bit "1" in "100". The ZQ pad voltage VZQ may be compared (e.g., by the comparator 386) with a ZQ arbitration reference voltage at an end of each clock cycle of a fixed duration of the ZQ timing pattern common to the chips. Another chip may be executing either the ZQ calibration arbitration process with priority or the ZQ calibration, if the ZQ pad voltage VZQ is in the pull-down voltage range, thus the current request fails and repeats Step 1 of the ZQ arbitration to re-request the ZQ calibration. After Step 3 (S403) is complete, the request may proceed to the fourth step of pulling down the ZQ pad voltage for a certain period (Step 4, S405) to signal that the ZQ calibration is being requested to the other chip. For example, the duration of this pulling down may be two clock cycles (e.g., T12 to T14 in FIG. 6A), or other clock cycles, without limitation.

The fifth step (Step 5, S405) of the fixed length time-based arbitration may include a stop bit detection. For each chip, a common stop bit of a fixed duration (e.g., from T14 to T15 in FIG. 6A) of the ZQ timing pattern common to the chips may be signaled by disabling pulling down the ZQ pad voltage VZQ during Step 5. The ZQ pad voltage VZQ may be compared (e.g., by the comparator 386) with a ZQ arbitration reference voltage at an end of the fixed duration (e.g., T15 in FIG. 6A) signaling the stop bit. Thus, the arbitration passes and ZQ calibration process for the current chip may be initiated, if the ZQ pad voltage VZQ is at the logic high state (e.g., in the pull-up voltage range). Another chip may be executing either the ZQ calibration arbitration process or the ZQ calibration process, if the ZQ pad voltage VZQ is in the pull-down voltage range, and the current request fails and repeats Step 1 of the ZQ arbitration to re-request the ZQ calibration.

Figure 6B:
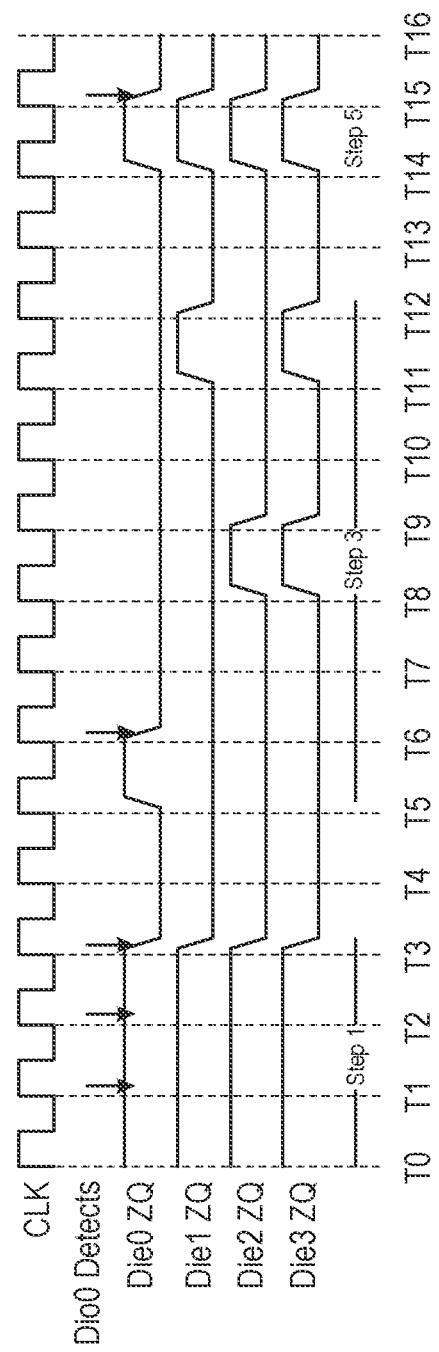
FIG. 6B is a timing diagram of a plurality of arbitration signal patterns for a plurality of chips in accordance with an embodiment of the present disclosure.

FIG. 6B is a timing diagram of a plurality of arbitration signal patterns for a plurality of chips in accordance with an embodiment of the present disclosure. Description of components and steps corresponding to components and steps (Steps 1, 2, 4 and 5) included in and previously described with reference to FIG. 6A will not be repeated. The third step (Step 3, S403) of the fixed length time-based arbitration may include another binary coding and detection, from T5 to T12 as shown in FIG. 6B. For example, Die0 may have a die number "100" and other chips Die1 to Die3 may have die numbers "001" to "011" that may be directly binary coded from a die identifier "1" to "3".

Figure 6C:
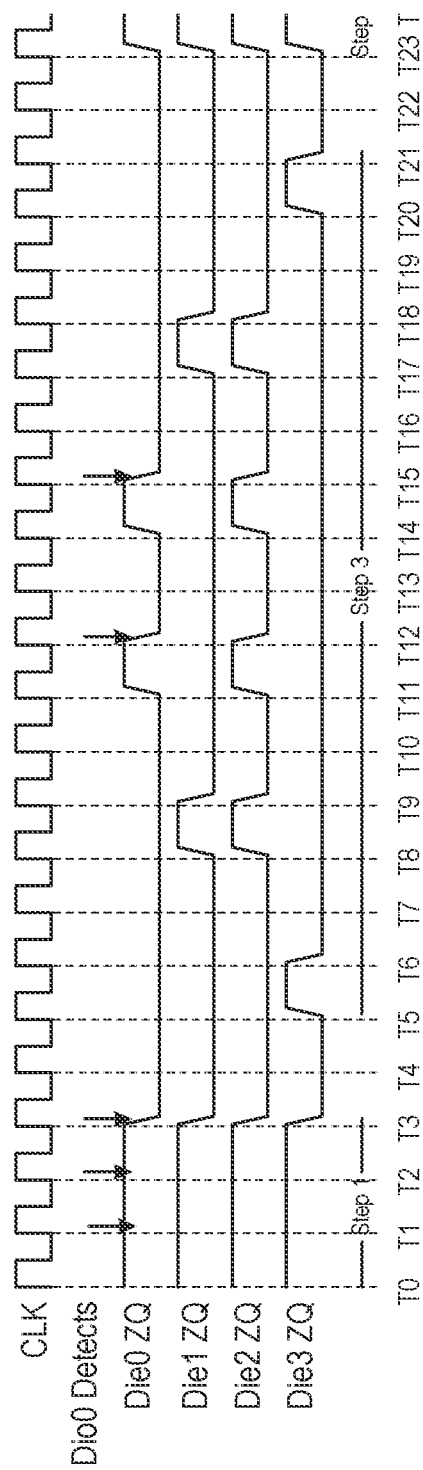
FIG. 6C is a timing diagram of a plurality of arbitration signal patterns for a plurality of chips in accordance with an embodiment of the present disclosure.

FIG. 6C is a timing diagram of a plurality of arbitration signal patterns for a plurality of chips in accordance with an embodiment of the present disclosure. Description of components and steps corresponding to components and steps (Steps 1, 2, 4 and 5) included in and previously described with reference to FIG. 6A will not be repeated. The third step (Step 3, S403) of the fixed length time-based arbitration may include another binary coding and detection, from T5 to T21 as shown in FIG. 6C. The die number binary coded for each chip may be mirrored in the timing diagram of FIG. 6C to be symmetrical with respect to the center of the ZQ timing pattern (e.g., in a time domain) during Step 3. For example, Die0 may have a die number "001100", Die1 may have a die number binary codes "010010". Die2 may have a die number "011110". Die3 may have a die number "100001". The mirrored ZQ timing pattern may be more resistant to aliasing with large oscillator variation.

Figure 7A:
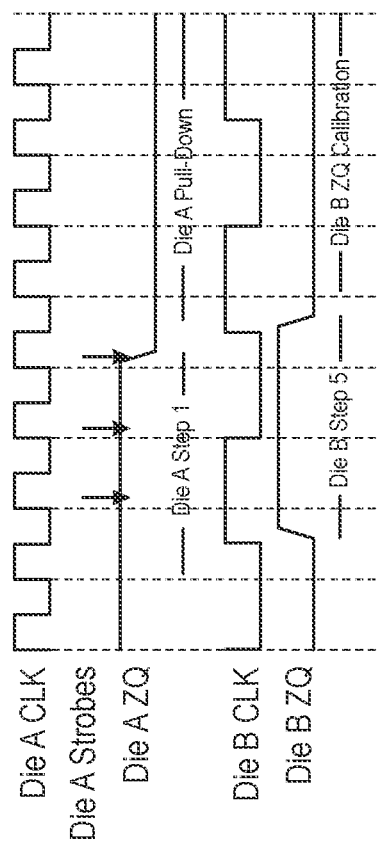
FIG. 7A is a timing diagram of a plurality of arbitration signal patterns for a plurality of chips in accordance with an embodiment of the present disclosure.

FIG. 7A is a timing diagram of a plurality of arbitration signal patterns for a plurality of chips in accordance with an embodiment of the present disclosure. Description of components and steps corresponding to components and steps included in and previously described with reference to FIGS. 6A-6C will not be repeated. If a clock cycle of one chip (e.g., Die B) in the plurality of chips is longer than a clock cycle of another chip (e.g., Die A) in the plurality of chips and a pulse width in a logic high state to signal a stop bit in Step 5 of the one chip (Die B) may be longer than a period between a first and third strobes in Step 1 of the other chip (Die A). Thus, the other chip (Die A) may fail to detect that the one chip (Die B) is proceeding to ZQ calibration. In order to prevent such failure, a pulse width in a float state of the one chip (Die B) may be configured shorter than two clock cycles of the other chip (Die A) as expressed in an inequality below.

$$FPW_{DieB} < 2T_{DieA} \qquad \text{(Inequality 1)}$$

Figure 7B:
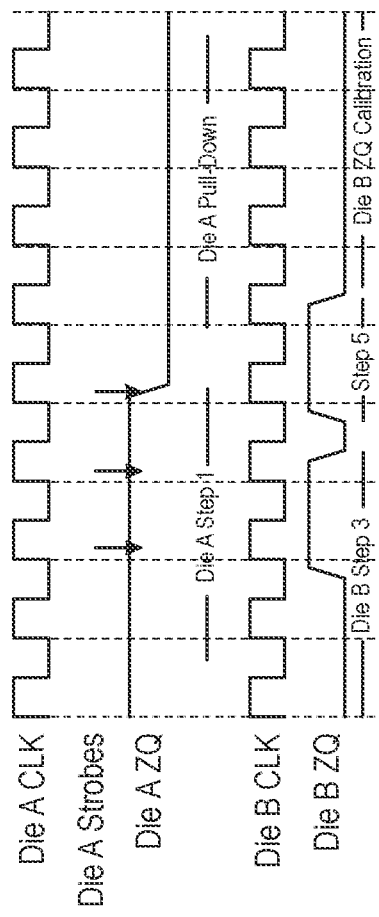
FIG. 7B is a timing diagram of a plurality of arbitration signal patterns for a plurality of chips in accordance with an embodiment of the present disclosure.

FIG. 7B is a timing diagram of a plurality of arbitration signal patterns for a plurality of chips in accordance with an embodiment of the present disclosure. Description of components and steps corresponding to components and steps included in and previously described with reference to FIGS. 6A-6C will not be repeated. If a pulse width of a last bit in Step 3 in a logic high state of one chip (e.g., Die B) is longer than a clock cycle of another chip (e.g., Die A), and the last bit is followed by the stop bit, the pulse width of the last bit in Step 3 of the one chip (Die B) may still overlaps the first and second strobes of Step 1 in the other chip (Die A) and the stop bit in Step 5 of the one chip (Die B) may coincide with the third strobe of Step 1 in the other chip (Die A). Thus, the other chip (Die A) may fail to detect that the one chip (Die B) is proceeding to ZQ calibration. In order to prevent such failure, duration of pulling-down the ZQ pad voltage in Step 2 and Step 4 may be configured to be longer than two clock cycles and the pulse width in a float high state in Step 3 and Step 5 may be configured to be shorter than one clock cycle.

FIG. 7C is a timing diagram of a plurality of arbitration signal patterns for a plurality of chips in accordance with an embodiment of the present disclosure. Description of components and steps corresponding to components and steps included in and previously described with reference to FIGS. 6A-6C will not be repeated. If a clock cycle of one chip (e.g., Die B) in the plurality of chips is three clock cycles of another chip (e.g., Die A) or longer in the plurality of chips, a pulse width corresponding to a third bit of a die number "00100" for the other chip (Die A) in Step 3 in a logic high state may coincide with a first bit of a die number "11xxx (x: don't care)" of the one chip (Die B) in Step 3 and a stop bit for the other chip (Die A) in Step 5 may coincide with a second bit of the die number of the one chip (Die B). Thus, the one chip (Die B) may fail to detect that the other chip (Die A) is proceeding to ZQ calibration. In order to prevent such failure, a clock cycle difference between chips may be configured to be limited to within 33%.

FIG. 7D is a timing diagram of a plurality of arbitration signal patterns for a plurality of chips in accordance with an embodiment of the present disclosure. Description of components and steps corresponding to components and steps included in and previously described with reference to FIGS. 6A-6C will not be repeated. Assuming that a clock cycle of one chip (e.g., Die B) in the plurality of chips is about one and half clock cycles of another chip (e.g., Die A) or longer in the plurality of chips, a pulse width corresponding to a third bit of a die number "00100" for the other chip (Die A) in Step 3 in a logic high state may coincide with a second bit of a die number "0101x (x: don't care)" of the one chip (Die B) in Step 3 and a stop bit for the other chip (Die A) in Step 5 may coincide with a fourth bit of the die number of the one chip (Die B). Thus, the one chip (Die B) may fail to detect that the other chip (Die A) is proceeding to ZQ calibration. In order to prevent such failure, a die number "00100" may be classified as illegal and prohibited to use (e.g., instead, use a die number "10100"). Logic levels of signals, particularly a binary coded die number used and/or prohibited in the embodiments described the above are merely examples and not limited to those specifically described in the above.

FIG. 7E is a timing diagram of a plurality of arbitration signal patterns for a plurality of chips in accordance with an embodiment of the present disclosure. Description of components and steps corresponding to components and steps included in and previously described with reference to FIGS. 6A-6C will not be repeated. If a clock cycle of one chip (e.g., Die B) in the plurality of chips is two clock cycles of another chip (e.g., Die A) or longer in the plurality of chips, a pulse width corresponding to a second bit, a fourth bit of a die number "01010" for the other chip (Die A) in Step 3 in a logic high state and a stop bit in Step 5 may coincide with first to third bits of a die number "111xx (x: don't care)" of the one chip (Die B) in Step 3, respectively. Thus, the one chip (Die B) may fail to detect that the other chip (Die A) is proceeding to ZQ calibration. This scenario may be prevented, if a clock cycle difference between chips may be configured to be limited to within 33% as described above referring to FIG. 7C.

Figure 8A:
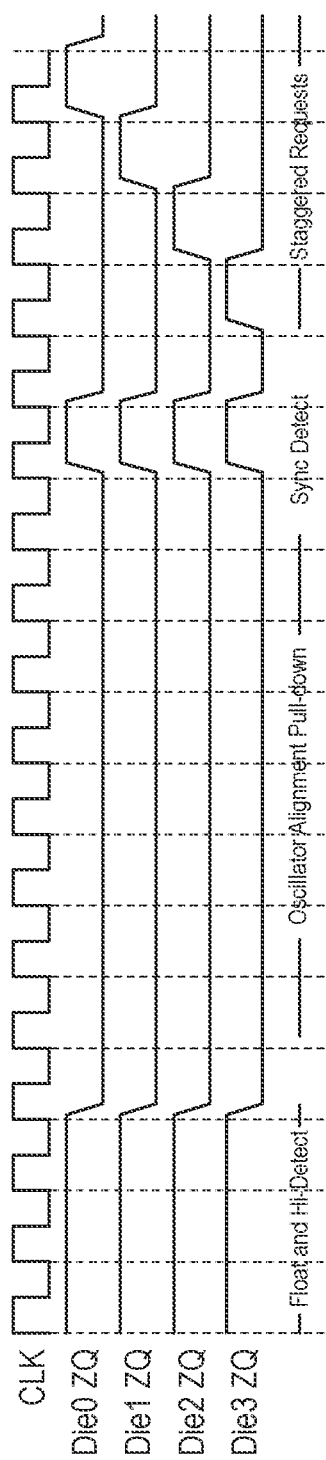
FIG. 8A is a timing diagram of a plurality of arbitration signal patterns for a plurality of chips in accordance with an embodiment of the present disclosure.

FIG. 8A is a timing diagram of a plurality of arbitration signal patterns for a plurality of chips in accordance with an embodiment of the present disclosure. Description of components and steps corresponding to components included in and previously described with reference to FIGS. 6A-6C will not be repeated. A first step of time-based arbitration is header detection (e.g., Float and Hi-Detect in FIG. 8A). For example, the header may be signaled by the ZQ pad voltage VZQ at a logic high level for three clock cycles. If the ZQ pad voltage VZQ is higher than the ZQ arbitration reference voltage during the header detection, the request may proceed to a second step of pulling down the ZQ pad voltage for a certain period (e.g., Oscillator Alignment Pull-down in FIG. 8A) to signal that the ZQ calibration is being requested to the other chip. For example, the duration of this pulling down may be nine clock cycles, or other clock cycles, without limitation. A third step (e.g., Sync Detect in FIG. 8A) of the time-based arbitration may include a sync bit detection. For each chip, a common sync bit of a fixed duration (e.g., one clock cycle) of the ZQ timing pattern common to the chips may be signaled by disabling pulling down the ZQ pad voltage VZQ for the fixed duration (e.g., one clock cycle) corresponding to the sync bit. Once the sync bit is detected, a fourth step of the time-based arbitration may include a ZQ calibration request detection (e.g., Staggered Requests in FIG. 8A). For each chip, a pulse with a same width and a delay unique to the chip may be assigned and signaled as a unique ZQ timing pattern. For example, the delay may be longer, if a priority of ZQ calibration to the chip is higher. If the ZQ pad voltage VZQ is higher than the ZQ arbitration reference voltage during the pulse, the request may proceed to the ZQ calibration.

Figure 8B:
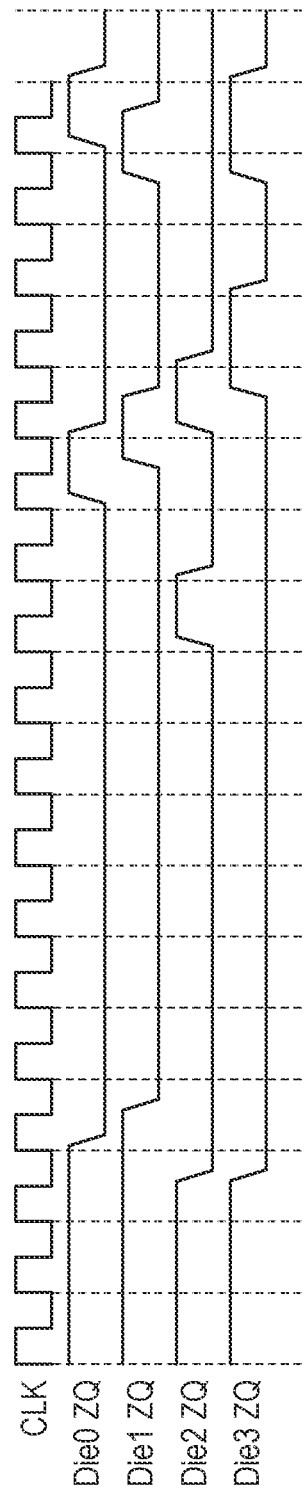
FIG. 8B is a timing diagram of a plurality of arbitration signal patterns for a plurality of chips in accordance with an embodiment of the present disclosure.

FIG. 8B is a timing diagram of a plurality of arbitration signal patterns for a plurality of chips in accordance with an embodiment of the present disclosure. Description of components and steps corresponding to components included in and previously described with reference to FIGS. 6A-6C and 8A will not be repeated. For example, timings (e.g., phases) of the first step including three clock cycles may differ for the plurality of chips. For example, the first step of Die1 may have a delay of a half clock cycle from the first step of Die0 that may have a delay of a half clock cycle from the first steps of Die2 and Die3. For example, durations of the second step including three clock cycles may differ for the plurality of chips due to different clock cycles of oscillators (e.g., oscillator 307 in FIG. 3) for the plurality of chips, in addition to different timings of the second step for the plurality of chips. For example, Die2 and Die3 may enter the second step at the same time, however, Die2 may proceed to the third step earlier than Die3 proceeds (e.g., three clock cycles before based on a clock signal CLK, as shown in FIG. 8B).

Figure 9A:
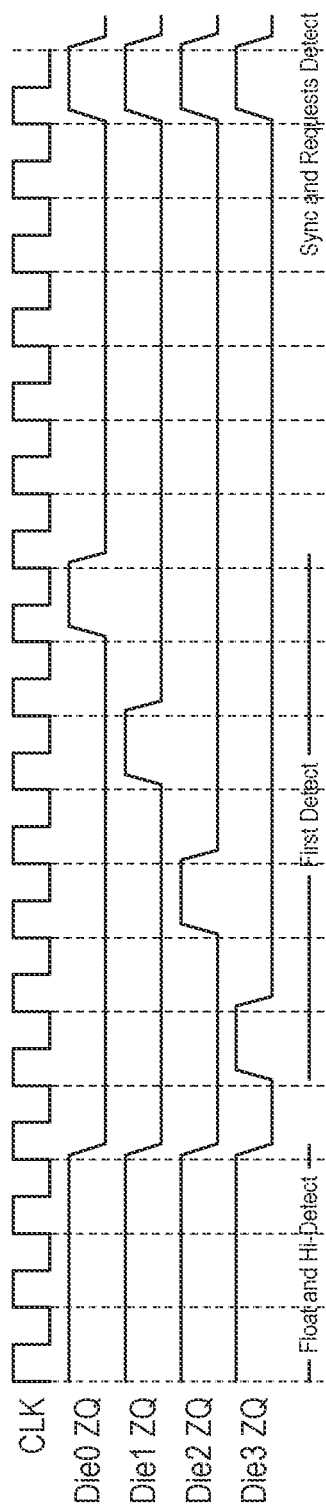
FIG. 9A is a timing diagram of a plurality of arbitration signal patterns for a plurality of chips in accordance with an embodiment of the present disclosure.

FIG. 9A is a timing diagram of a plurality of arbitration signal patterns for a plurality of chips in accordance with an embodiment of the present disclosure. Description of components and steps corresponding to components included in and previously described with reference to FIGS. 6A-6C will not be repeated. For example, the ZQ calibration may start with a fixed length time-based arbitration. A first step of the fixed length time-based arbitration is header detection (e.g., Float and Hi-Detect in FIG. 9A). For example, the header may be signaled by the ZQ pad voltage VZQ at a logic high level for three clock cycles. If the ZQ pad voltage VZQ is higher than the ZQ arbitration reference voltage during the header detection, the request may proceed to a second step of the fixed length time-based arbitration may include a ZQ calibration request detection (e.g., First Detect in FIG. 9A). For each chip, a pulse with a same width and a delay unique to the chip may be assigned and signaled in a same duration of the second step as a unique ZQ timing pattern. For example, the delay may be longer, if a priority of ZQ calibration to the chip is higher. If the ZQ pad voltage VZQ is lower than the ZQ arbitration reference voltage during the pulse, the request may fail and repeats Step 1 of the ZQ arbitration to re-request the ZQ calibration. After the second step, a third step (e.g., Sync and Requests Detect in FIG. 9A) of the fixed length time-based arbitration may be executed. For each chip, a common request period for a plurality of clock cycles (e.g., six clock cycles in a logic low state in FIG. 9A) by pulling-down the ZQ pad voltage VZQ followed by a common sync bit by disabling pulling down the ZQ pad voltage VZQ for a fixed duration (e.g., one clock cycle) may be signaled. The arbitration passes and ZQ calibration process for the current chip may be initiated, once the sync bit is detected by detecting the ZQ pad voltage VZQ at the logic high state (e.g., in the pull-up voltage range). Another chip may be executing either the ZQ calibration arbitration process or the ZQ calibration process, if the ZQ pad voltage VZQ is in the pull-down voltage range, and the current request fails and repeats Step 1 of the ZQ arbitration to re-request the ZQ calibration.

Figure 9B:
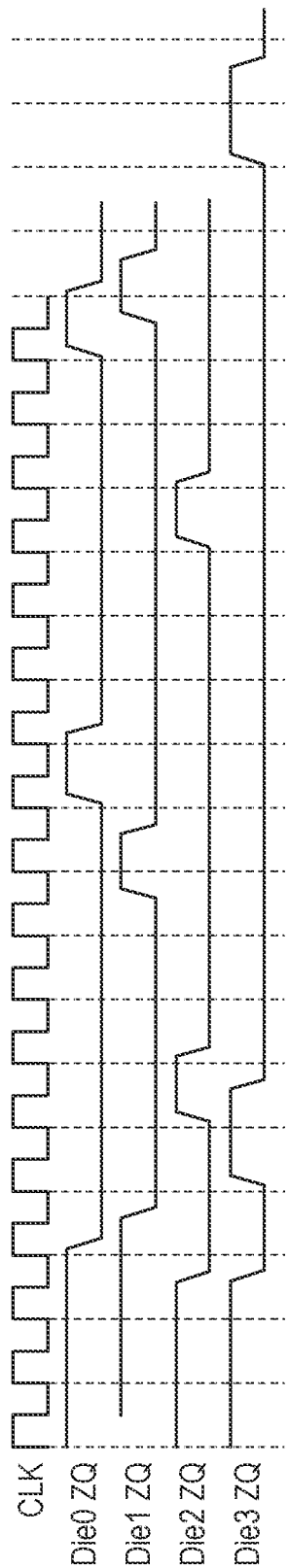
FIG. 9B is a timing diagram of a plurality of arbitration signal patterns for a plurality of chips in accordance with an embodiment of the present disclosure.

FIG. 9B is a timing diagram of a plurality of arbitration signal patterns for a plurality of chips in accordance with an embodiment of the present disclosure. Description of components and steps corresponding to components included in and previously described with reference to FIGS. 6A-6C, 8B and 9A will not be repeated. For example, timings (e.g., phases) of the first step including three clock cycles may differ for the plurality of chips. For example, the first step of Die1 may have a delay of a half clock cycle from the first step of Die0 that may have a delay of a half clock cycle from the first steps of Die2 and Die3. For each chip, a pulse with a same number of clock cycle (one clock cycle) and a delay (e.g., a unique number of clock cycles) may be assigned and signaled in a same number of clock cycles for each chip of the second step as a unique ZQ timing pattern. For example, durations of the second step including the pulse may differ for the plurality of chips due to different clock cycles for the plurality of chips in a same number of clock cycles of the second step, in addition to different timings of the second step for the plurality of chips. After the second step, a third step (e.g., Sync and Requests Detect in FIG. 9A) of the fixed length time-based arbitration may be executed. For example, Die2 and Die3 may enter the second step at the same time, however, Die2 may proceed to the sync bit of the third step earlier than Die3 proceeds (e.g., six clock cycles before, as shown in FIG. 8B), due to different clock cycles of oscillators (e.g., oscillator 307 in FIG. 3) for the plurality of chips.

Figure 10A:
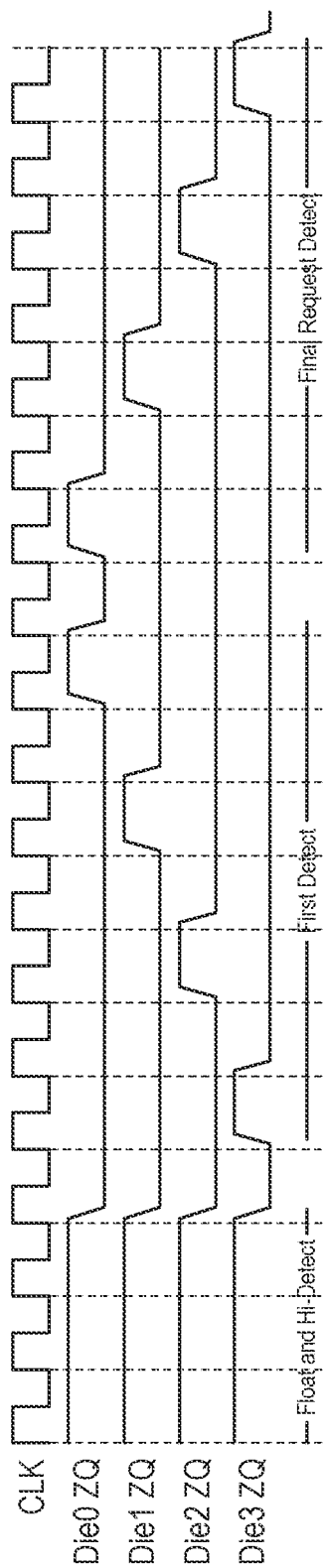
FIG. 10A is a timing diagram of a plurality of arbitration signal patterns for a plurality of chips in accordance with an embodiment of the present disclosure.

FIG. 10A is a timing diagram of a plurality of arbitration signal patterns for a plurality of chips in accordance with an embodiment of the present disclosure. Description of components and steps corresponding to components included in and previously described with reference to FIGS. 6A-6C and 9A will not be repeated. In the second step, unlike including one pulse in FIG. 9A, the ZQ timing pattern includes two pulses. Similarly to FIG. 6C, the die number linear coded for each chip may be mirrored in the timing diagram of FIG. 10A to be symmetrical with respect to the center of the second step of the ZQ timing pattern. Thus the first pulse is included in a first period (e.g., First Detect in FIG. 10A) and the second pulse is included in a second period (e.g., Final Request Detect in FIG. 10A) in the second step. The mirrored ZQ timing pattern in FIG. 10A may be more resistant to aliasing with large oscillator variation.

Figure 10B:
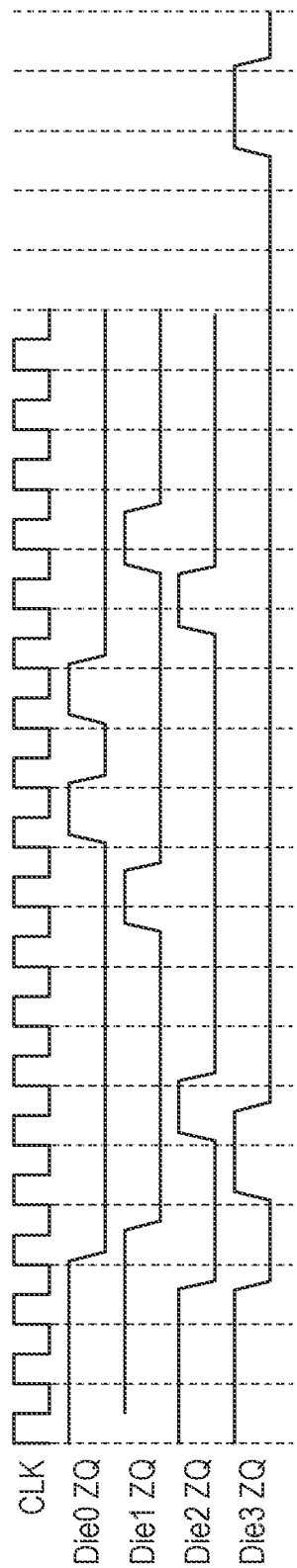
FIG. 10B is a timing diagram of a plurality of arbitration signal patterns for a plurality of chips in accordance with an embodiment of the present disclosure.

FIG. 10B is a timing diagram of a plurality of arbitration signal patterns for a plurality of chips in accordance with an embodiment of the present disclosure. Description of components and steps corresponding to components included in and previously described with reference to FIGS. 6A-6C, 8B and 10A will not be repeated. For example, timings (e.g., phases) of the first step including three clock cycles may differ for the plurality of chips. For each chip, two pulses with a same number of clock cycle (one clock cycle) and a delay (e.g., a unique number of clock cycles) mirrored in the timing diagram of FIG. 10B to be symmetrical with respect to the center of the second step of the ZQ timing pattern may be assigned and signaled in a same number of clock cycles for each chip of the second step as a unique ZQ timing pattern. For example, durations of the second step including the pulses may differ for the plurality of chips due to different clock cycles for the plurality of chips in a same number of clock cycles of the second step, in addition to different timings of the second step for the plurality of chips. For example, Die2 and Die3 may enter the second step at the same time, however, Die2 may proceed to the ZQ calibration earlier than Die3 proceeds, due to different clock cycles of oscillators (e.g., oscillator 307 in FIG. 3) for the plurality of chips. The mirrored ZQ timing pattern may be more resistant to aliasing with large oscillator variation.

Logic levels of signals used in the embodiments described the above are merely examples. However, in other embodiments, combinations of the logic levels of signals other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. A method comprising:
floating a voltage of an external pad for a first period of time;
pulling down the voltage of the external pad to a first voltage state for a second period of time; and
pulling down or floating the voltage of the external pad for individual ones of a plurality of clock cycles, wherein whether the voltage of the external pad is pulled down or floated for a clock cycle of the plurality of clock cycles is based, at least in part, on timing information unique to a chip of a plurality of chips.

2. The method of claim 1, further comprising, prior to pulling down the voltage of the external pad to the second voltage state for the second period of time, comparing the voltage of the external pad to a reference voltage to determine whether the voltage of the external pad is at the first voltage state or a second voltage state, wherein when the voltage of the external pad is determined to be the first voltage state, the method further comprises repeating floating the voltage of the external pad for the first period of time.

3. The method of claim 1, further comprising comparing the voltage of the external pad to a reference voltage to determine whether the voltage of the external pad is at the first voltage state or a second voltage state after each clock cycle of the plurality of clock cycles, wherein when the voltage of the external pad is determined to be the first voltage state, the method further comprises repeating floating the voltage of the external pad for the first period of time.

4. The method of claim 1, wherein the first period of time is three clock cycles.

5. The method of claim 1, wherein the second period of time is two clock cycles.

6. The method of claim 1, wherein the first period of time is based, at least in part, on the timing information unique to the chip of the plurality of chips.

7. The method of claim 1, wherein the second period of time is based, at least in part, on the timing information unique to the chip of the plurality of chips.

8. A method comprising:
floating a voltage of an external pad to or pulling down the voltage of the external pad to a first voltage state for individual ones of a plurality of clock cycles, wherein whether the voltage of the external pad is pulled down or floated for a clock cycle of the plurality of clock cycles is based, at least in part, on timing information unique to a chip of a plurality of chips;
determining whether the voltage of the external pad is at the first voltage state or a second voltage state after each clock cycle of the plurality of clock cycles; and
responsive to determining the voltage of the external pad is the first voltage state, floating the voltage of the external pad for a period of time.

9. The method of claim 8, further comprising wherein responsive to determining the voltage of the external pad is the second voltage state, after at last clock cycle of the plurality of clock cycles, pulling down the voltage of the external pad to the first voltage state for a second period of time.

10. The method of claim 9, further comprising floating the voltage of the external pad for a third period of time following the second period of time.

11. The method of claim 10, further comprising pulling down the voltage of the external pad to the second voltage state; and
performing a ZQ calibration operation.

12. The method of claim 10, wherein the third period of time is one clock cycle.

13. The method of claim 9, wherein the second period of time is two clock cycles.

14. The method of claim 8, wherein the timing information comprises a binary code.

15. The method of claim 14, wherein the binary code is mirrored in a time domain.

16. A method comprising:
floating a voltage of an external pad for a plurality of clock cycles;
determining whether the voltage of the external pad is at a high voltage state or a low voltage state at an end of each clock cycle of the plurality of clock cycles;
responsive to the voltage of the external pad being at the low voltage state, repeating floating the voltage of the external pad for the plurality of clock cycles; and
responsive to the voltage of the external pad being at the high voltage state, after the plurality of clock cycles, providing a voltage pulse to the external pad after a delay, wherein the delay is unique to a chip of a plurality of chips.

17. The method of claim 16, wherein the delay is longer for a chip having a higher priority than the delay for a chip having a lower priority of the plurality of chips.

18. The method of claim 16, wherein floating the voltage of the external pad for the plurality of clock cycles is performed at a different phase for at least one chip of the plurality of chips.

19. The method of claim 16, further comprising pulling down the voltage of the external pad to the low voltage state after the plurality of clock cycles for a number of clock cycles equal to the delay.

20. The method of claim 16, further comprising performing a ZQ calibration operation after providing the voltage pulse.

* * * * *